(12) United States Patent
Taussig et al.

(10) Patent No.: US 6,861,365 B2
(45) Date of Patent: Mar. 1, 2005

(54) METHOD AND SYSTEM FOR FORMING A SEMICONDUCTOR DEVICE

(75) Inventors: Carl Phillip Taussig, Redwood City, CA (US); Ping Mei, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 292 days.

(21) Appl. No.: 10/184,567

(22) Filed: Jun. 28, 2002

(65) Prior Publication Data

US 2004/0002216 A1 Jan. 1, 2004

(51) Int. Cl.⁷ .............................................. H01L 21/302
(52) U.S. Cl. ...................................... 438/725; 430/312
(58) Field of Search ............................... 438/706, 714, 438/725; 430/312, 315

(56) References Cited

U.S. PATENT DOCUMENTS 5,308,415 A * 5/1994 Chou ......................... 438/714
6,165,911 A    12/2000 Calveley
6,255,035 B1 * 7/2001 Minter et al. ............... 430/312
6,519,761 B1 * 2/2003 Satoh .......................... 716/21

FOREIGN PATENT DOCUMENTS

JP         2002162747         * 11/2000

* cited by examiner

*Primary Examiner*—Kin-Chan Chen

(57) ABSTRACT

A method and system for forming a semiconductor device is provided. The method and system involves the utilization of a stamping tool to generate three-dimensional resist structures whereby thin film patterning steps can be transferred to the resist in a single molding step and subsequently revealed in later processing steps. Accordingly, the alignments between successive patterning steps can be determined by the accuracy with which the stamping tool has been fabricated, regardless of the dilations or contractions that can take place during the fabrication process.

20 Claims, 32 Drawing Sheets

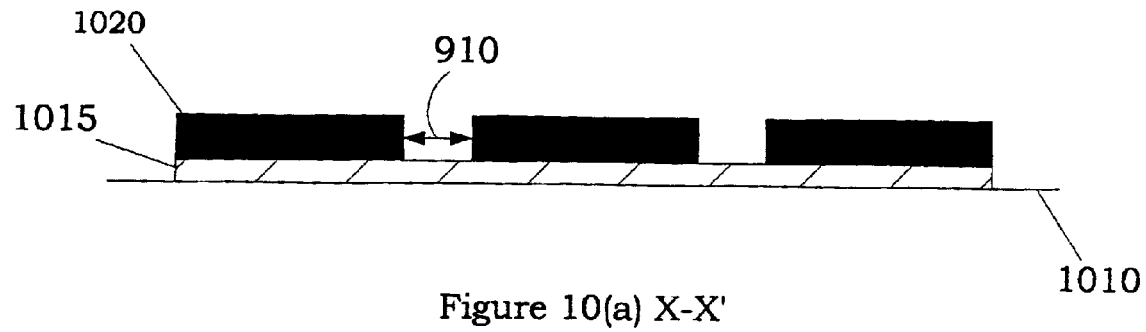
Figure 10(a) X-X'
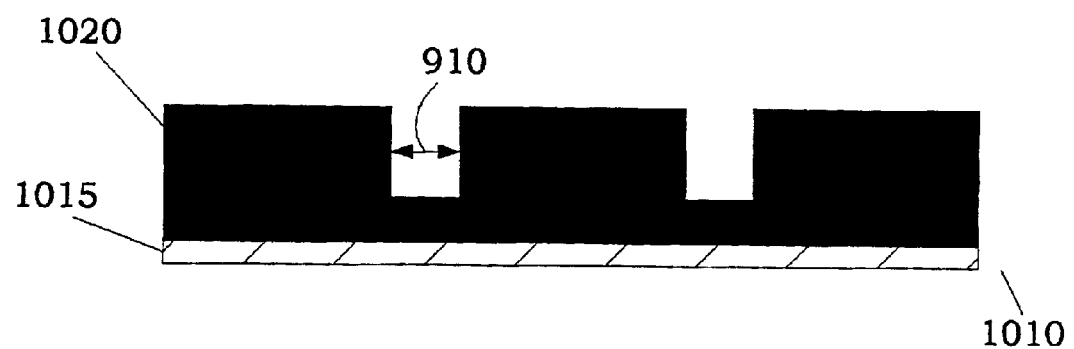
Figure 10(b) Y-Y'

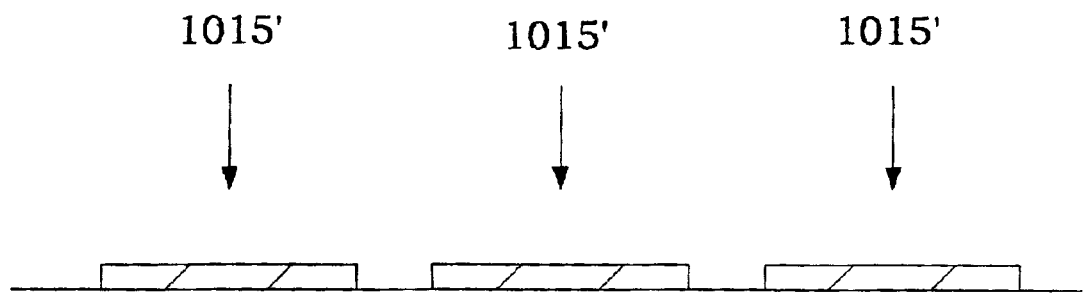
Figure 10(c) X-X'
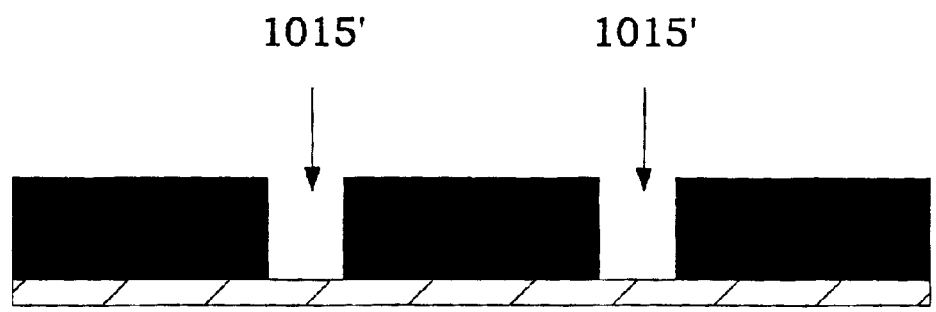
Figure 10(d) Y-Y'

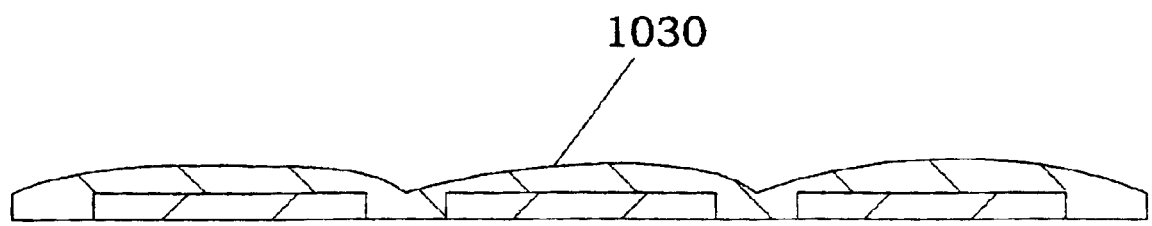
Figure 10(e)  X-X'
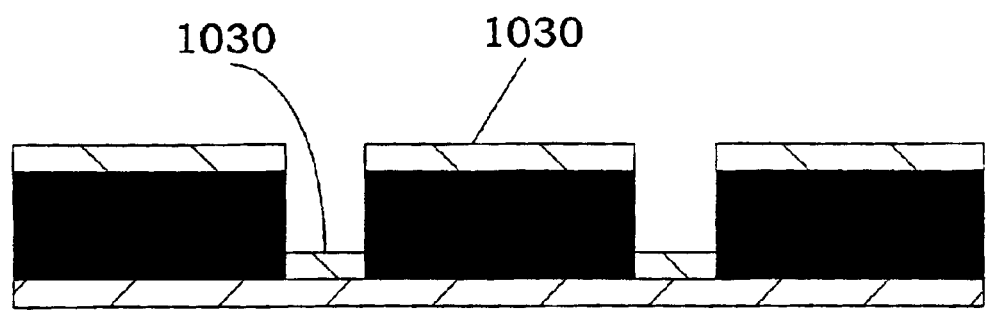
Figure 10(f)  Y-Y'

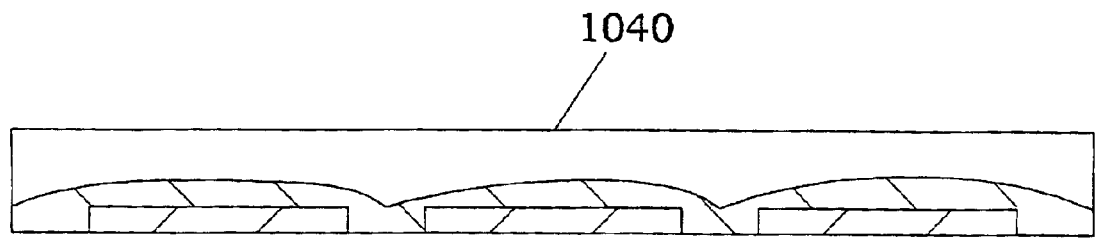
Figure 10(g)  X-X'
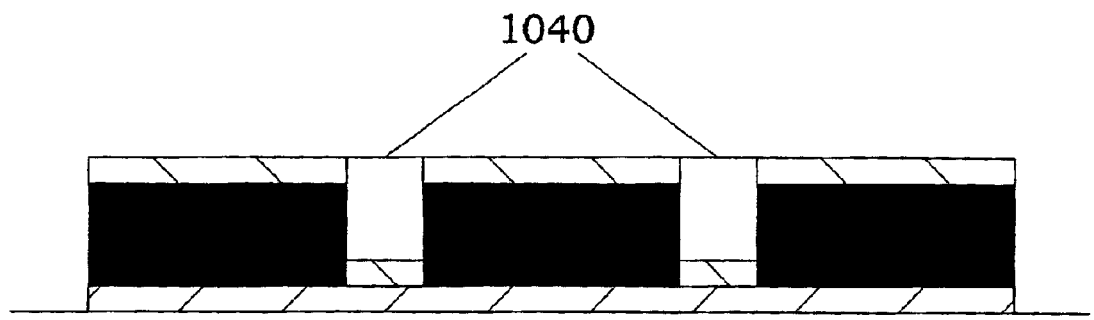
Figure 10(h) Y-Y'

Figure 10(i)  X-X'
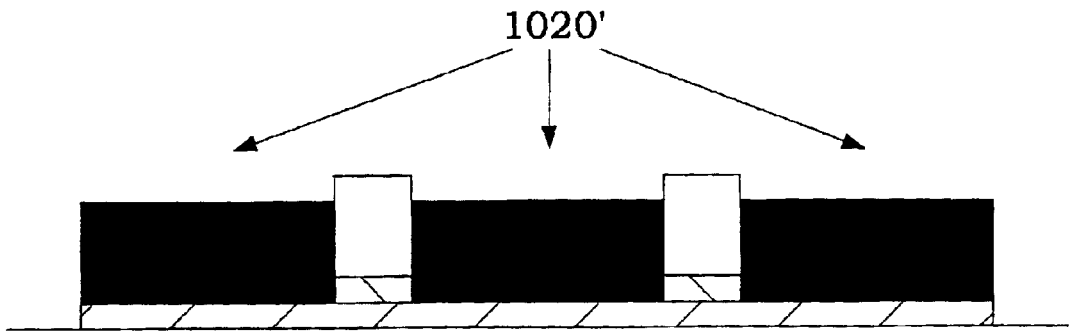
Figure 10(j)  Y-Y'

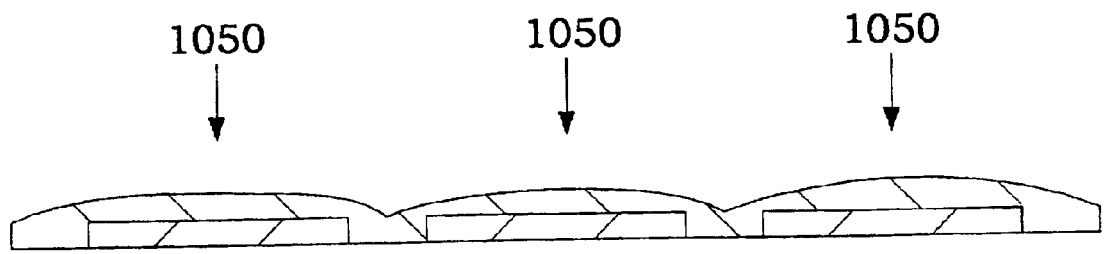
Figure 10(k) X-X'
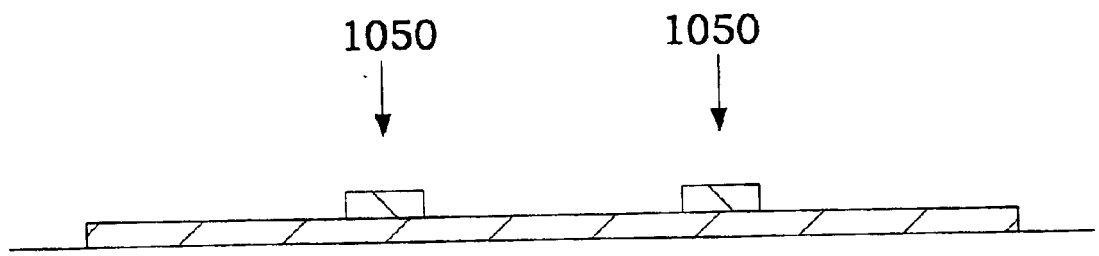
Figure 10(l) Y-Y'

METHOD AND SYSTEM FOR FORMING A SEMICONDUCTOR DEVICE

FIELD OF INVENTION

The present invention relates generally to the field of semiconductor devices and more particularly to a method and system for forming a semiconductor device.

BACKGROUND OF THE INVENTION

There is currently a strong trend toward downsizing existing structures and fabricating smaller structures. This process is commonly referred to as microfabrication. One area in which microfabrication has had a sizeable impact is in the microelectronic area. In particular, the downsizing of microelectronic structures has generally allowed the structures to be less expensive, have higher performance, exhibit reduced power consumption, and contain more components for a given dimension. Although microfabrication has been widely active in the electronics industry, it has also been applied to other applications such as biotechnology, optics, mechanical systems, sensing devices, and reactors.

One method employed in the microfabrication process is imprint lithography. Imprint lithography is typically utilized to pattern thin films on a substrate material with high resolution. The thin films patterned can be dielectrics, semiconductors, metals or organics and can be patterned as thin films or individual layers. Imprint lithography is particularly useful for patterning devices in a roll-to roll environment since imprint lithography is not as sensitive to planarity as conventional photolithography. Additionally, imprint lithography has a higher throughput and can handle wider substrates.

Typically, the fabrication of an electronic device will require several patterning steps that often must be aligned with each other with a degree of accuracy approaching or even exceeding the minimum feature size. In conventional photolithography, optical alignment marks are used to guarantee alignment between successive patterning steps. Although, it is possible to use optical alignments in a roll-to-roll process it is not practical for several reasons. First, it adds additional complexity since the fundamental imprint lithography process is not optical. Next, the lack of planarity of the substrate in a roll-to-roll environment causes difficulties in the accuracy with which optical alignments can be made due to depth of field restrictions and other optical aberrations. Finally, the flexible substrates used in roll-to-roll processing may experience dimensional changes due to variations in temperature, humidity, or mechanical stress. These contractions or dilations of one patterned layer with respect to the next may make alignments of a large area impossible.

Accordingly, what is needed is a method and system for fabricating a device that overcomes the above referenced problems. The method and system should be simple, cost effective and capable of being easily adapted to existing technology. The present invention addresses these needs.

SUMMARY OF THE INVENTION

The invention includes a method and system for forming a semiconductor device. The invention involves the utilization of a stamping tool to generate three-dimensional resist structures whereby thin film patterning steps can be transferred to the resist in a single molding step and subsequently revealed in later processing steps. Accordingly, the alignments between successive patterning steps can be determined by the accuracy with which the stamping tool has been fabricated, regardless of the dilations or contractions that can take place during the fabrication process.

A first aspect of the invention includes a method for forming a semiconductor device. The method comprises providing a substrate, depositing a first layer of material over the substrate and forming a 3-dimensional (3D) resist structure over the substrate wherein the 3D resist structure comprises a plurality of different vertical heights throughout the structure.

A second aspect of the invention includes a system for forming a semiconductor device comprising means for depositing a first layer of material over a flexible substrate, means for depositing a layer of resist over the flexible substrate, means for transferring a 3D pattern to the layer of resist to form a 3D layer of resist over the flexible substrate and means for utilizing the 3D layer of resist to form a cross-point array over the flexible substrate.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 10(*a*)–10(*l*) illustrate a third embodiment of forming a cross-point array by utilizing capillary forces.

DETAILED DESCRIPTION OF THE INVENTION

Figure 1:
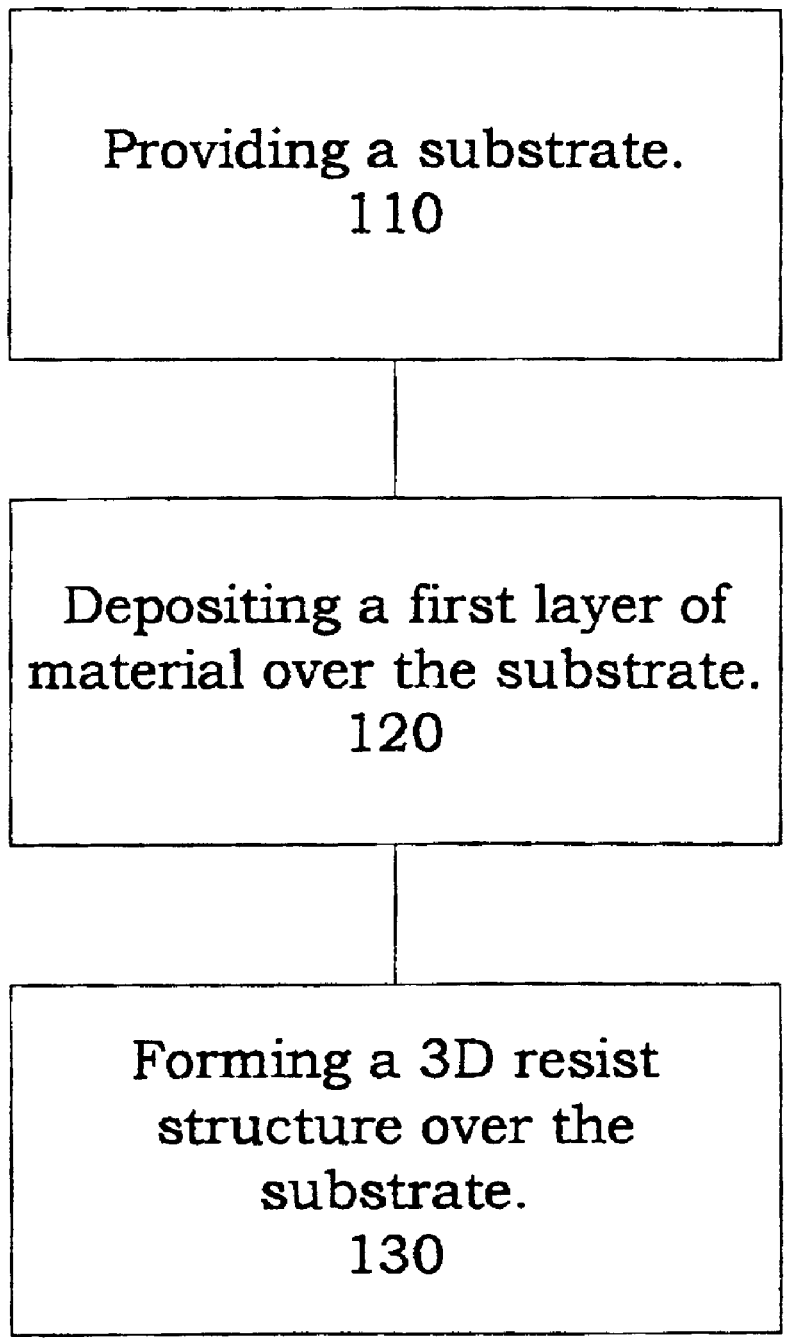
FIG. 1 is a high-level flow chart of the method in accordance with the present invention.

The present invention relates to a method and system for forming a semiconductor device. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

As shown in the drawings for purposes of illustration, the invention is a method and system for forming a semiconductor device. The invention involves the utilization of a stamping tool to generate three-dimensional resist structures whereby a plurality of patterns can be transferred to the resist in a single molding step and subsequently revealed in later processing steps.

Although the present invention has been described as being utilized to form a semiconductor device, one of ordinary skill in the art will readily recognize that the present invention could be utilized to form other types of devices (e.g. mechanical, optical, biological, etc.) while remaining within the spirit and scope of the present invention.

For a better understanding of the present invention please refer to FIG. 1. FIG. 1 is a high-level flow chart of the method in accordance with the present invention. First, a substrate is provided, via step 110. Preferably, the substrate comprises a flexible substrate adequate for use in a roll-to-roll fabrication process. Next, a layer of material is deposited over the substrate, via step 120. The material preferably comprises an organic or inorganic material. Finally, a 3-dimensional (3D) resist structure is formed over the first layer of material wherein the 3D resist structure comprises a plurality of different vertical heights throughout the structure, via step 130. Preferably, the 3D resist structure is generated by utilizing a stamping tool. Since the 3D resist structure comprises a plurality of different vertical heights throughout the structure, the structure can be utilized to transfer alignment patterns to an underlying layer based on subsequent etching steps.

Figure 2A:
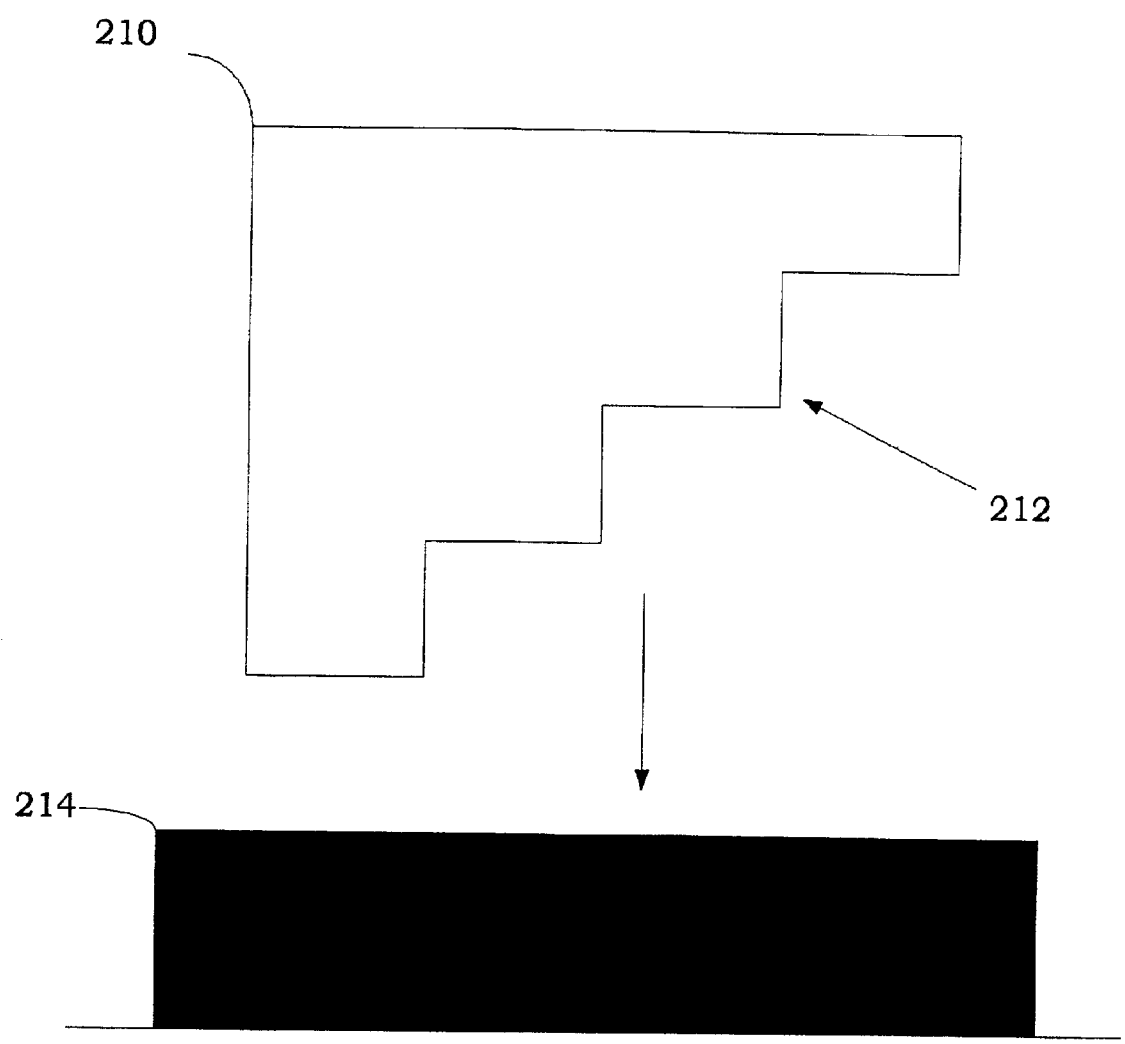
FIGS. 2(*a*)–2(*c*) show the formation of a 3D resist structure utilizing a stamping tool.
Figure 2B:
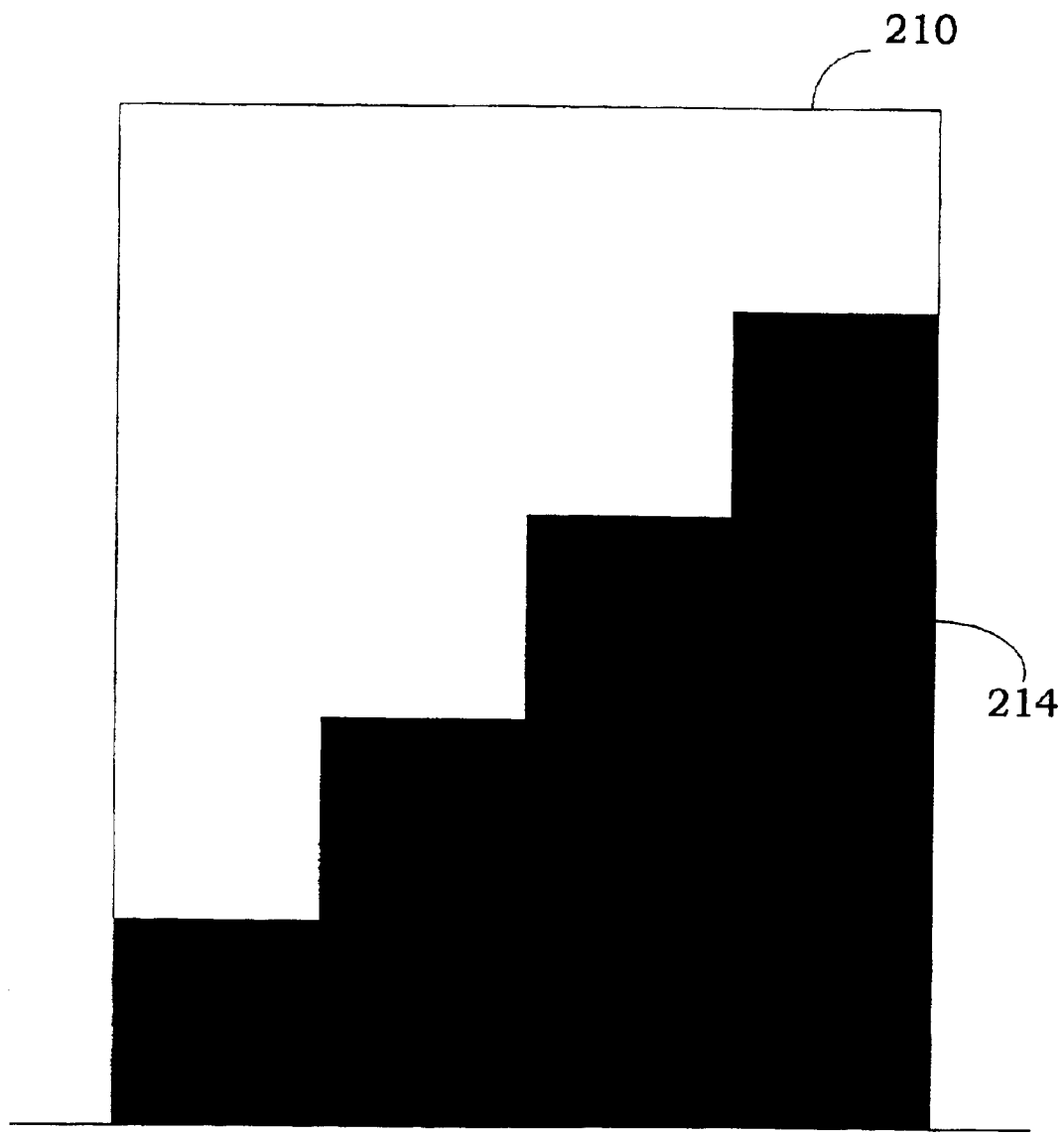
Figure 2C:
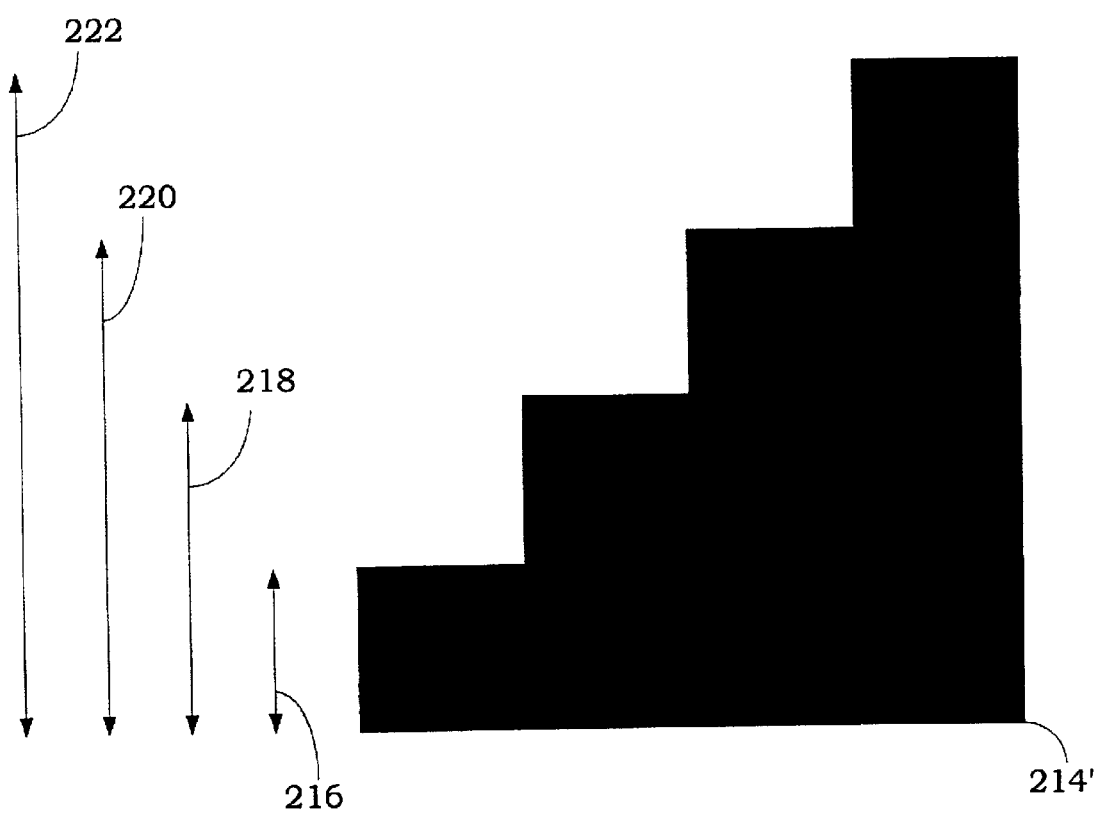

As previously mentioned, this invention involves the utilization of a stamping tool to create a 3D resist structure over a flexible substrate. For a clearer understanding of this concept, please refer to FIGS. 2(a)–2(c). FIGS. 2(a)–2(c) show cross-sections of the formation of a 3D resist structure utilizing a stamping tool. FIG. 2(a) shows a cross-section of the stamping tool 210 and an unformed layer of resist material 214. The stamping tool 210 includes the 3D pattern 212 that will be transferred to the layer of resist 214. The resist layer 214 could comprise any of a variety of commercially available polymers. For example, a polymer from the Norland optical adhesives (NOA) family of polymers could be used.

The stamping tool 210 is then brought into contact with resist layer 214 thereby displacing the resist layer 214 into the 3D pattern 212 of the stamping tool 210. FIG. 2(b) shows a cross-section of the stamping tool 210 having been brought into contact with the resist layer 214. The displaced resist layer 214 is then cured utilizing ultraviolet lithography or any other suitable curing means. FIG. 2(c) shows a cross-section of the formed resist layer 214'.

Additionally, as can be seen in FIG. 2(c), the formed resist layer 214' or resist structure, comprises different vertical heights 216, 218, 220, 222. Preferably, the vertical heights are discretely different i.e. at least one height is substantially different from another height. Accordingly, these different vertical heights allow the structure 214' to be utilized to transfer alignment patterns to an underlying layer based on subsequent etching steps. These structures are particularly useful in the formation of cross-point memory arrays.

Cross-point Arrays

Preferably, the cross-point memory array comprises two layers of orthogonal sets of spaced parallel conductors arranged with a semiconductor layer therebetween. The two sets of conductors form row and column electrodes overlaid in such a manner that each of the row electrodes intersects each of the column electrodes at exactly one place.

Figure 3:
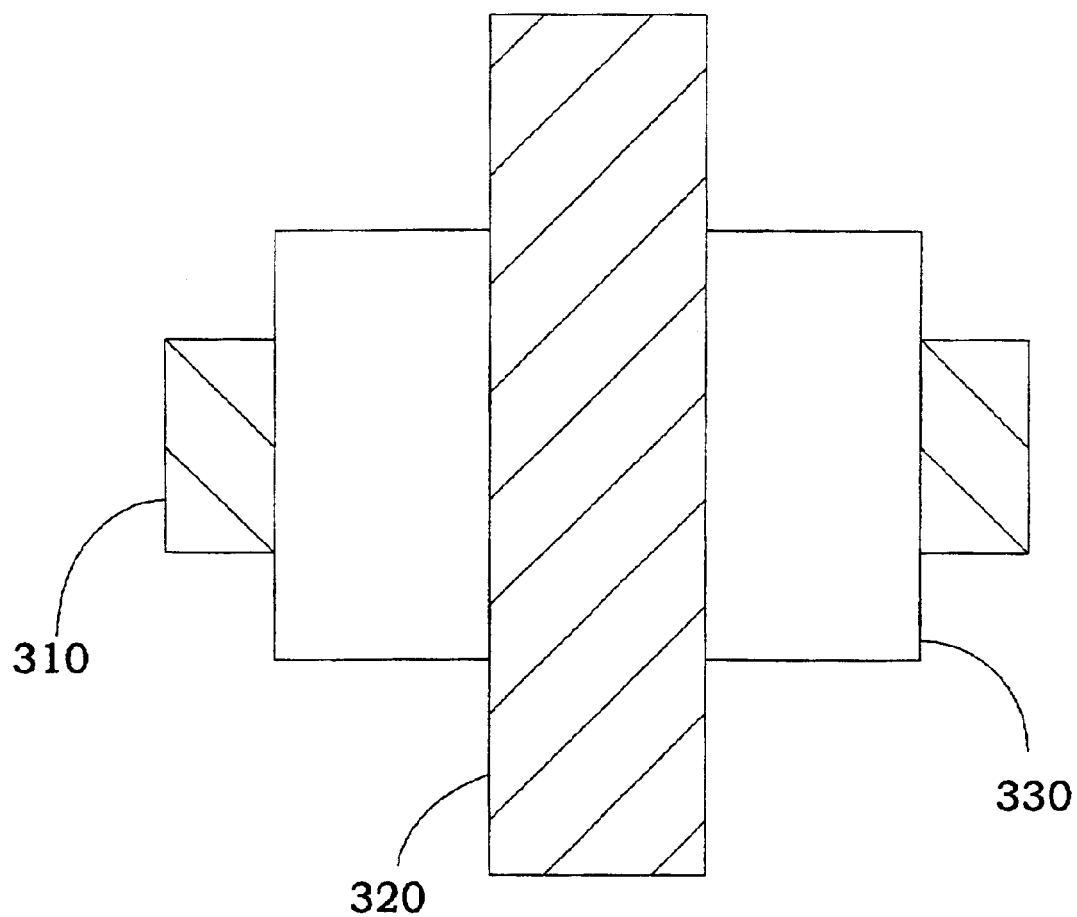
FIG. 3 is an illustration of a cross-point array configuration.

For a more detailed understanding of a cross-point array, please refer now to FIG. 3. FIG. 3 is an illustration of a cross-point array configuration 300. At each of the intersections, a connection is made between the row electrode 310 and column electrode 320 through a semiconductor layer 330 which acts in the manner of a diode and a fuse in series. The diodes in the array are all oriented so that if a common potential is applied between all the row electrodes and all the column electrodes then all the diodes will be biased in the same direction. The fuse element may be realized as a separate element that will open-circuit when a critical current is passed there through or it may be incorporated in the behavior of the diode.

One of ordinary skill in the art will readily recognize that the above described cross-point arrays could be utilized in the formation of a variety of semiconductor devices including, but not limited to, transistors, resistors, capacitors, etc. while remaining within the spirit and scope of the present invention.

Three different approaches will now be presented for utilizing the aforementioned 3D resist structure to form a cross-point array. The first approach utilizes the "shadowing" effect in conjunction with the 3D structure to form a cross-point array; the second approach utilizes two polymers with mutual etch selectivity to form the cross-point array; the third approach utilizes the effect of capillary forces to generate the 3D structure and form the cross-point array. Although three approaches are described, one of ordinary skill will readily recognize that the 3D resist structure could be utilized in conjunction with a variety of different approaches while remaining within the spirit and scope of the present invention.

Shadowing Effect

The first approach to utilizing the 3D resist structure to form a cross-point array takes into account the shadowing effect. The shadowing effect is the phenomenon whereby under proper conditions when a thin film is deposited on a surface that contains trenches with steep sidewalls, the deposited material will aggregate preferentially on the surfaces normal to the direction of deposition and avoid covering the sidewalls. Depositing at an angle and thereby 'shadowing' one of the sidewalls can sometimes enhance this effect.

Figure 4A:
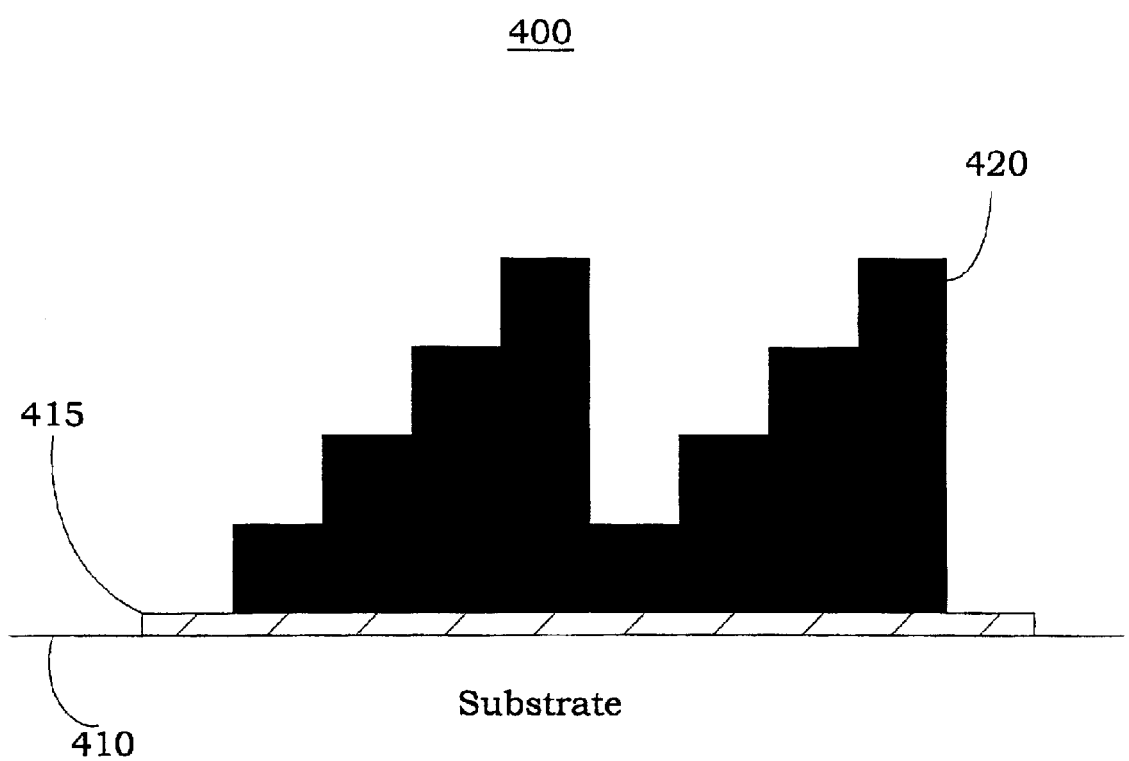
FIGS. 4(*a*)–4(*g*) illustrate a first embodiment of forming a cross-point array utilizing the shadowing effect.

For a better understanding of how the shadowing effect is taken into account in this approach, please refer now to FIGS. 4(a)–4(g) in conjunction with the following description. FIGS. 4(a)–4(g) illustrate a process of forming a cross-point array utilizing the shadowing effect. FIG. 4(a) is a side view of a configuration 400 comprising a flexible substrate 410, a first layer of material ('first thin film stack') 415, and a formed 3D resist structure 420.

Figure 4B:
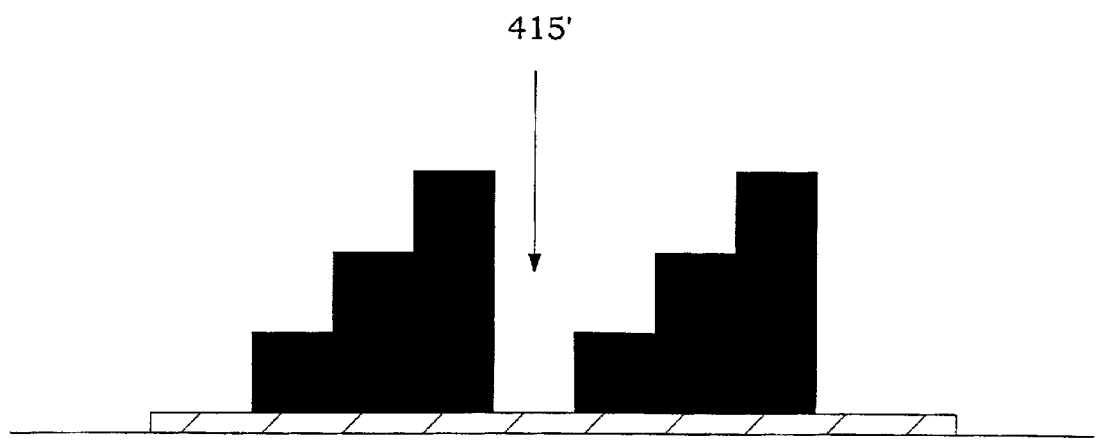
Figure 4C:
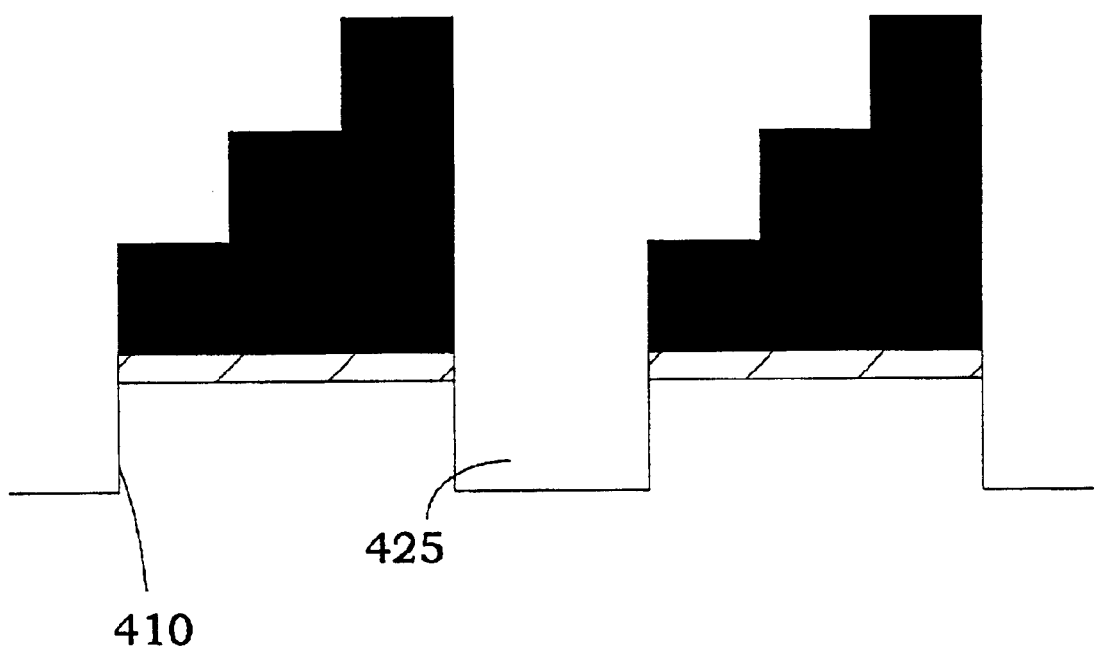

Once, the resist structure is formed, the process begins by removing the thinnest layer of the resist structure via an anisotropic etch process thereby exposing a portion of the first thin film stack. FIG. 4(b) shows exposed portions 415' the first thin film stack. Next, using the same or different etch chemistry, the exposed portion of the first thin film stack is etched whereby a plurality of pockets are formed in the substrate. FIG. 4(c) shows the configuration after pockets 425 have been etched into the substrate 410. It is important that during this process that the sidewalls of the pockets remain steep and the pockets have a depth much greater than the thickness of the first thin film stack. Ideally, it is best if the pockets in the substrate slightly undercut the first thin film stack in order to enhance the 'shadowing' effect.

Figure 4D:
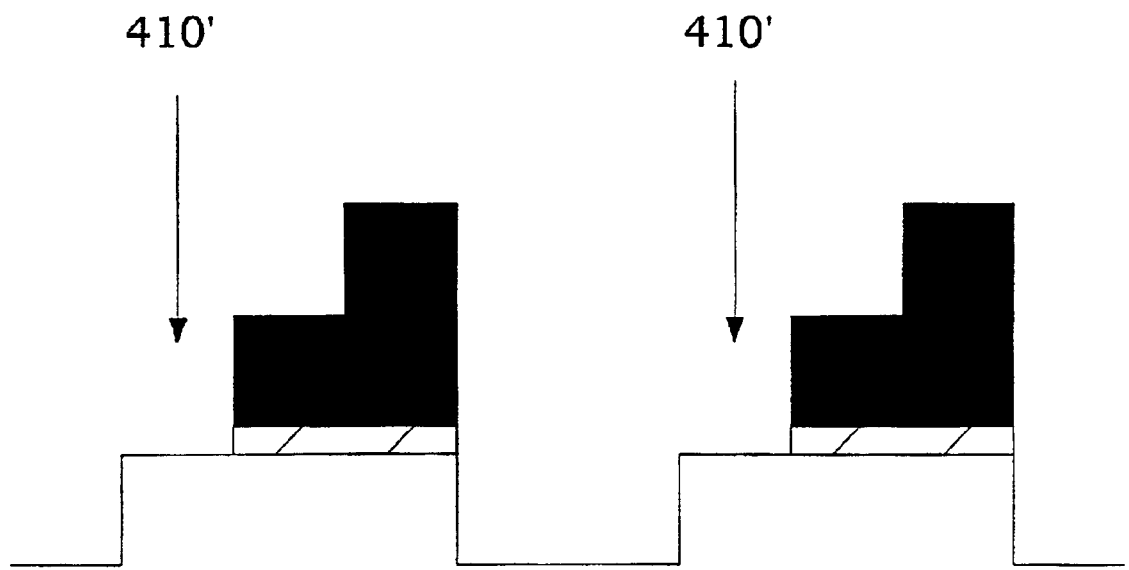

Next, the next thinnest layer of the resist structure is etched thereby exposing a second portion of the first thin film stack. The exposed second portion of the first thin film stack is then etched through. However, in this step, etching is stopped when the thin film stack is removed from the substrate beneath it. FIG. 4(d) shows the exposed substrate 410' after this step.

Figure 4E:
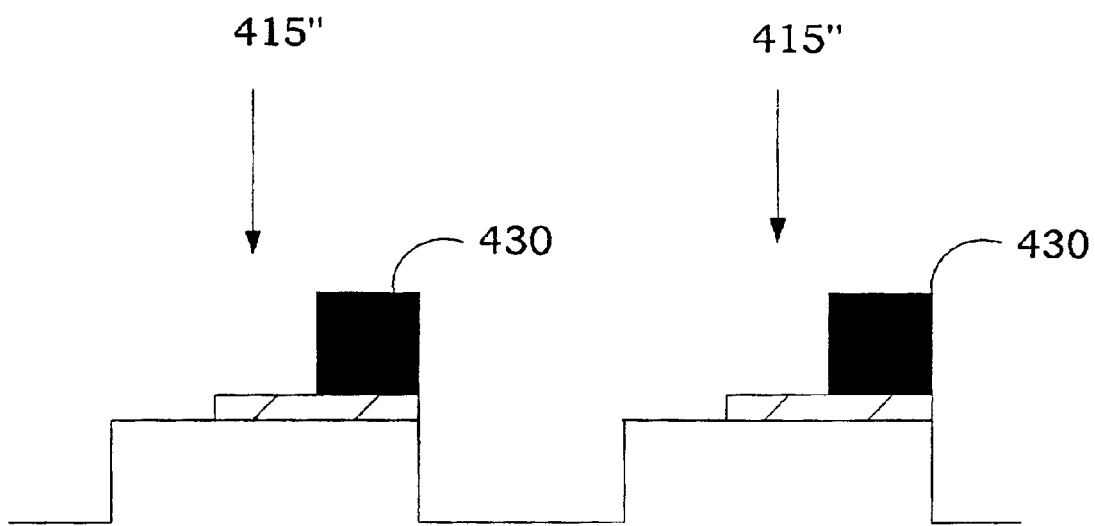

In the next step, the next thinnest portion of the resist structure is etched thereby exposing a third portion of the first thin film stack. However, in this step, the exposed portion of the first thin film stack is not etched. At the completion of this step, all that remains of the original resist are a series of isolated islands. FIG. 4(e) shows the isolated islands of resist 430 and the exposed portions 415" of the first thin film stack.

Figure 4F:
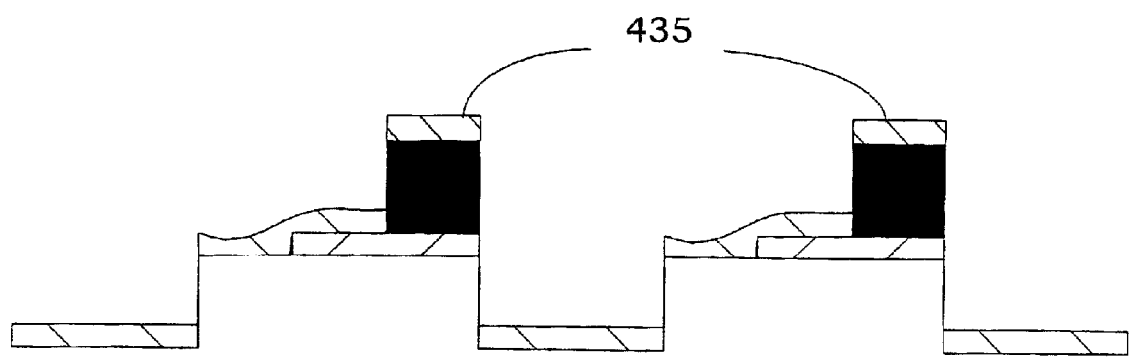

Next, a second layer of material (second thin film stack) is deposited over the entire configuration. The second thin film stack preferably comprises a semiconductor material and a conductive material. The conditions of these depositions will be such that the small step, resulting from the thickness of the first thin film stack, will be covered conformally. However, the larger steps, corresponding to the sidewalls of the pockets, will not be covered. FIG. 4(f) shows the second thin film stack 435 after deposition.

Figure 4G:
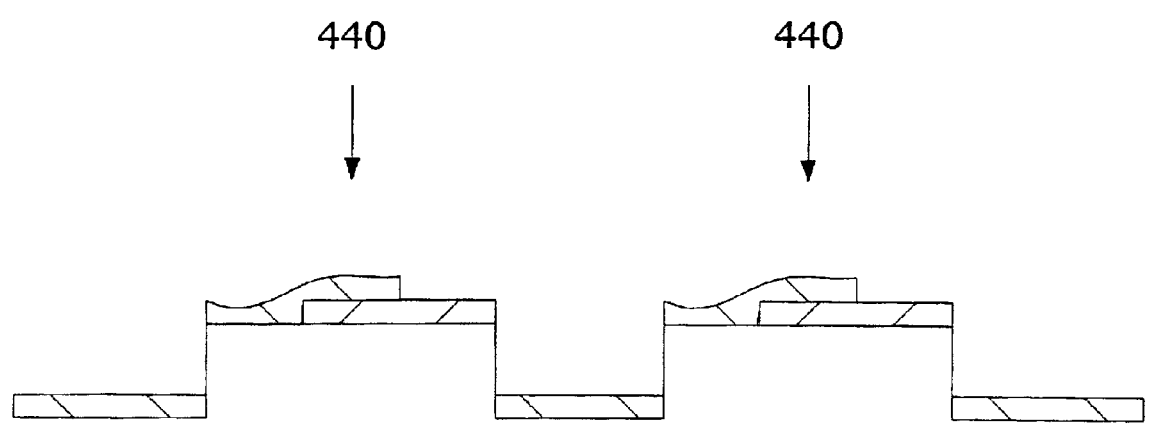

Finally, the remaining portion of the resist structure is removed thereby forming a cross-point array. FIG. 4(g) shows the structure comprising of the cross-point arrays 440. Although at the end of this step, cross-point arrays have been formed, an additional step may include a light cleaning to remove any residual films on the sidewalls that could possibly produce shunts in the final device.

Figure 5:
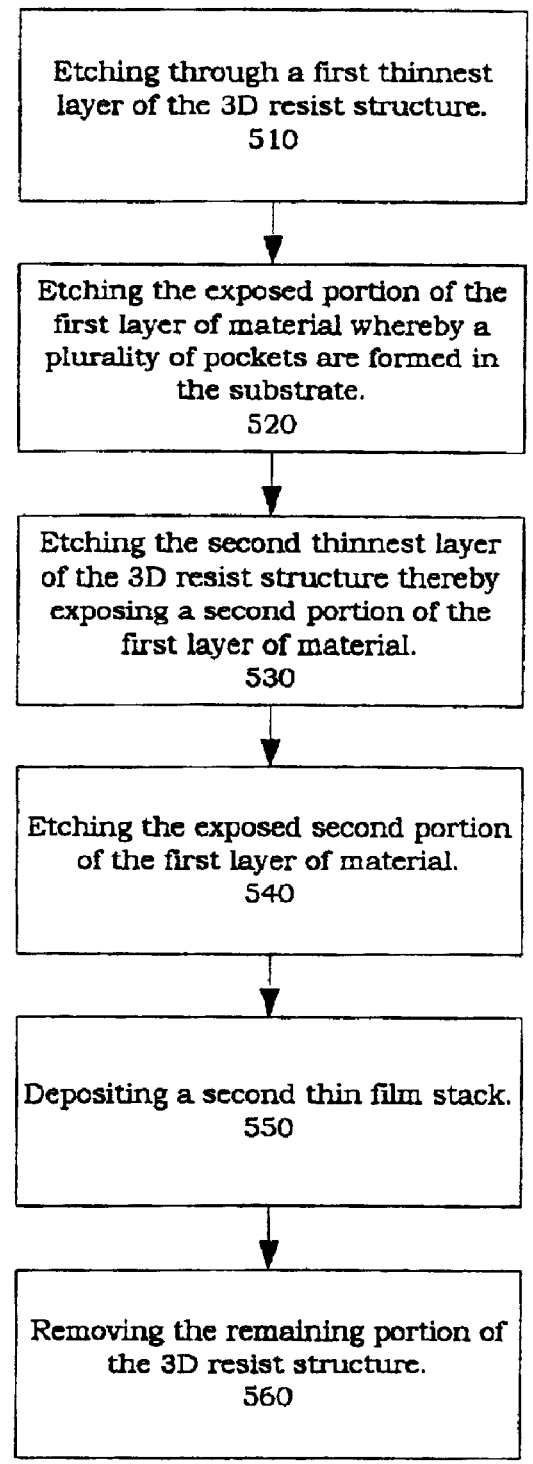
FIG. 5 is a flowchart of the first embodiment of the method in accordance with the present invention.

For a better understanding of the above-described approach, please refer now to FIG. 5. FIG. 5 is a flowchart of the above-described method in accordance with the present invention. First, once the resist structure is formed, a first thinnest layer of the resist structure is anisotropically etched, thereby exposing a first portion of the first thin film stack, via step 510. Next, the exposed first portion of the first thin film stack is etched whereby a plurality of pockets are formed in the substrate, via step 520. Preferably, the pockets comprise a depth much greater than the first thin film stack and slightly undercut the first thin film stack thereby enhancing the shadowing effect. Next, a second thinnest layer of the resist is etched thereby exposing a second portion of the first thin film stack, via step 530.

The exposed second portion of the first thin film stack is then etched, via step 540. A second thin film stack is then deposited, via step 550. Preferably, the second thin film stack comprises a semiconductor material and a conductive material. Also, the conditions of these depositions are such that the small step, resulting from the thickness of the first thin film stack, will be covered while the larger steps, corresponding to the sidewalls of the pockets, will not be covered. Finally, the remaining portion of the resist is removed, via step 560.

Two Mask Polymers with Mutual Etch Selectivity

The second approach to utilizing the 3D resist structure to form a cross-point array employs two polymers with properties such that each compound can be etch at a much greater rate than the other under certain conditions, e.g. for polymers A and B, the etch for polymer 'A' does not effect polymer 'B' and the etch for polymer 'B' does not effect polymer 'A'. These conditions may comprise differing etch chemistries, different flow rates, different partial pressures, different plasma power, etc. Additionally, it is preferable that both these etch recipes be anisotropic dry etches.

Although the above-described approach is disclosed as being utilized in conjunction with polymer materials, one of ordinary skill in the art will readily recognize that any material that can be molded, cast and then cured could be utilized in place of the polymer material as a resist while remaining within the spirit and scope of the present invention. For example, spin-on-glass (SOG) could be utilized as the second polymer in the above-described embodiment of the present invention.

Figure 6A:
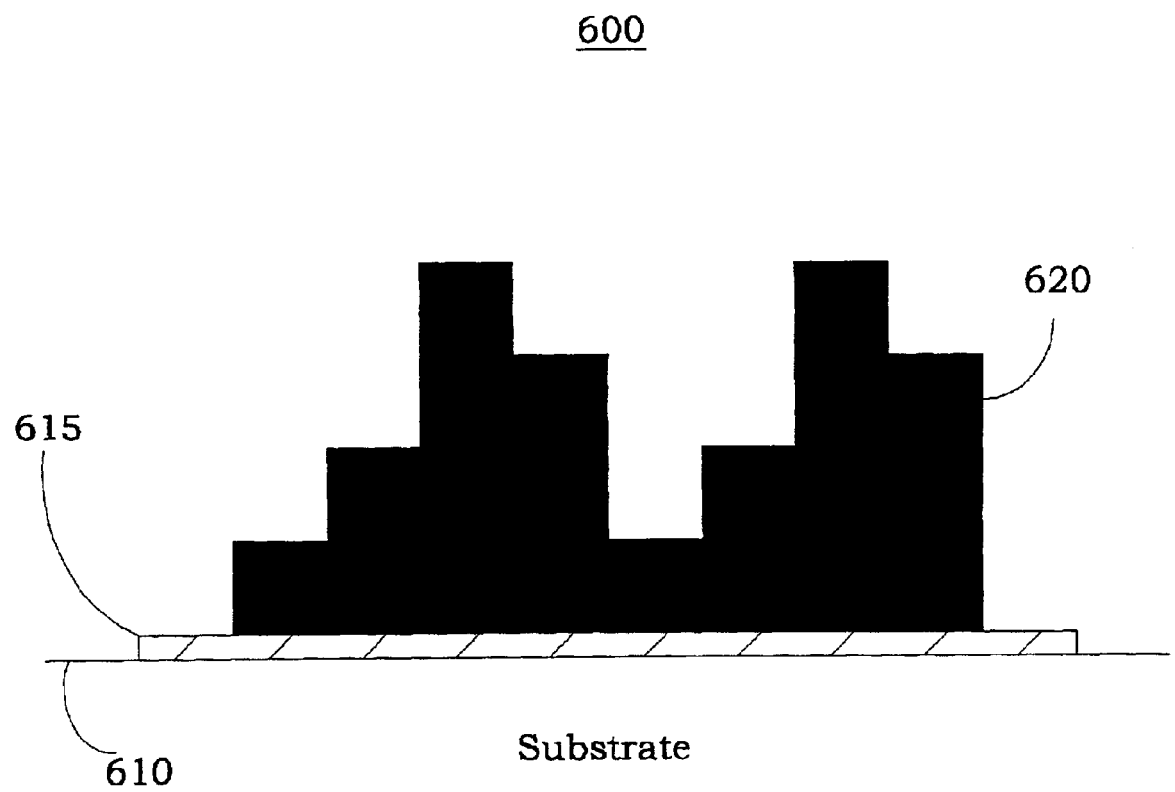
FIGS. 6(*a*)–6(*i*) illustrate a second embodiment of forming a cross-point array utilizing two polymers.
Figure 6B:
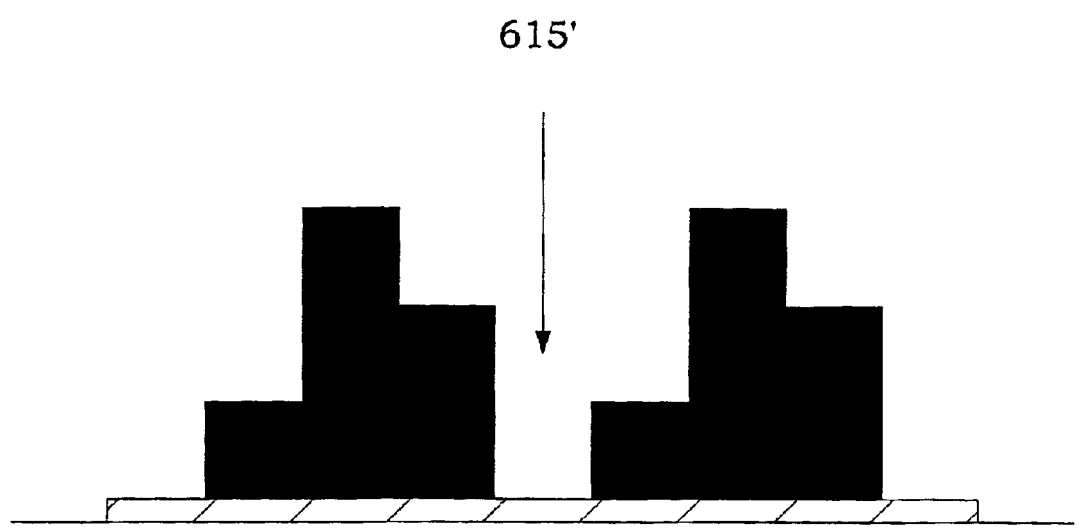

For a better understanding of this approach, please refer now to FIGS. 6(a)–6(i) in conjunction with the following description. FIGS. 6(a)–6(i) illustrate a process of forming a cross-point array utilizing two polymers. FIG. 6(a) shows a configuration 600 comprising a flexible substrate 610, a first layer of material ('first thin film stack') 615, and a formed 3D resist structure 620 wherein a plurality of different vertical heights are present throughout the structure 620. Once, the resist structure is formed, the thinnest layer of the resist structure is removed via an anisotropic etch process thereby exposing a portion of the first thin film stack. FIG. 6(b) shows the exposed portion of the first thin film stack 615'.

Figure 6C:
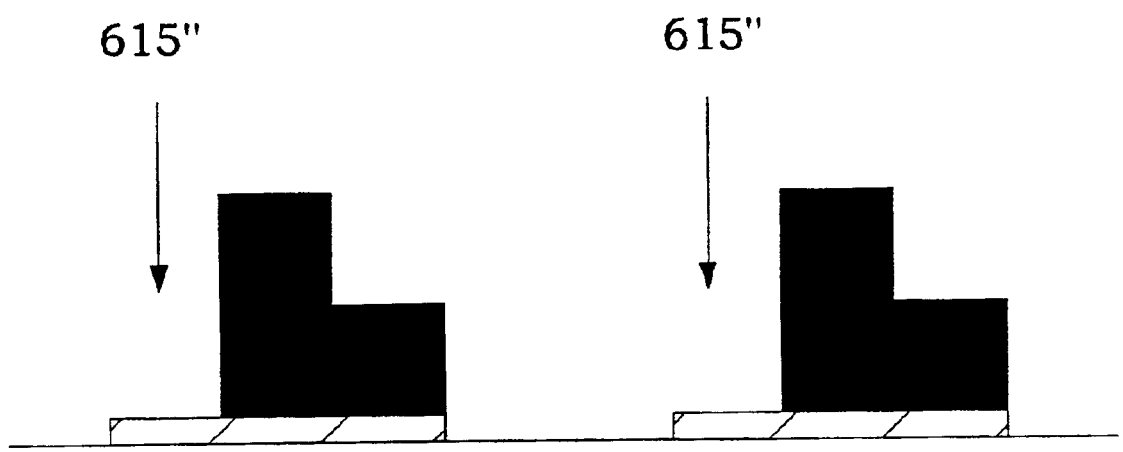

Next, using the same or different etch chemistry, the exposed portion of the first thin film stack is etched. Ideally, these etch processes should remove the first thin film stack at a similar or greater rate than the rate at which they erode the resist structure. Next, the next thinnest layer of the resist structure is etched thereby exposing a second portion of the first thin film stack wherein the second exposed portion of the first thin film stack is adjacent to the areas etched in the previous step. FIG. 6(c) shows the second exposed portions 615" of the first thin film stack.

Figure 6D:
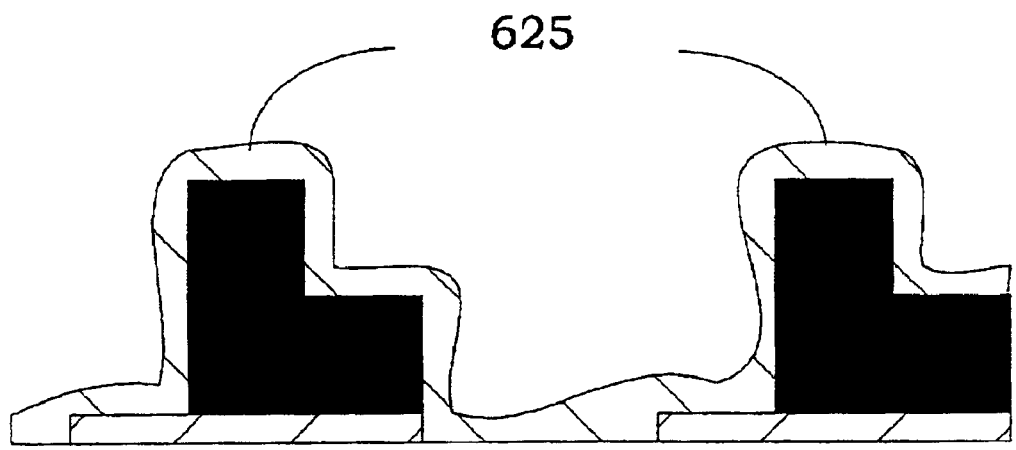

Next, a second layer of material (second thin film stack) is deposited. The second thin film stack preferably comprises a semiconductor material and a conductive material. All the exposed surfaces of the substrate, first thin film stack and resist may be coated in this step. FIG. 6(d) shows the deposited second thin film stack 625.

Figure 6E:
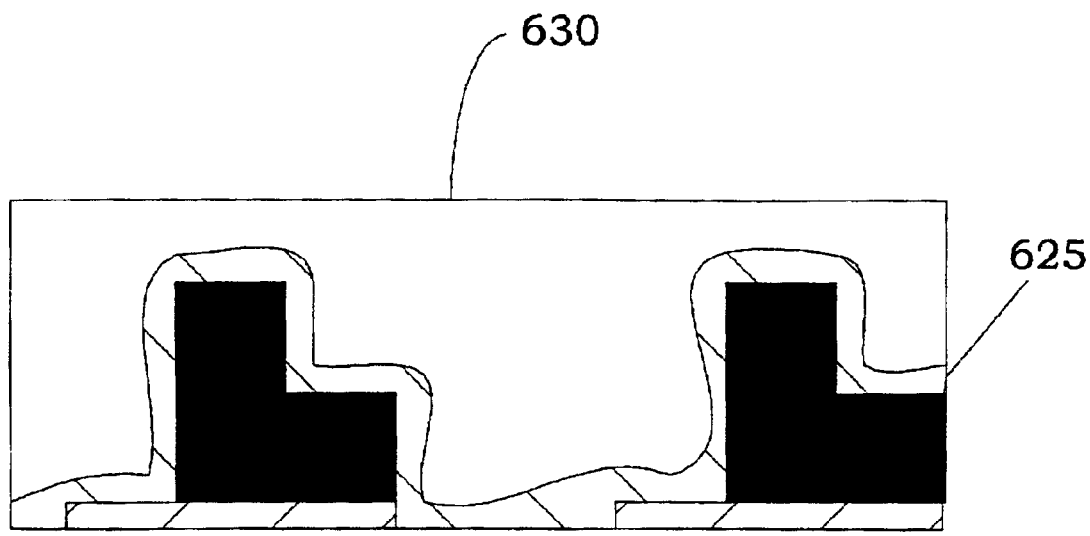

A second polymer is then applied over the second thin film stack. This coating may be applied by a roll coating process such as a gravure coating or may be applied by vacuum or vapor deposition. This coating is intended to planarize the structure and should result in a substantially planar surface covering all of the topology produced by the preceding steps. FIG. 6(e) shows the second polymer layer 630 covering the second thin film layer 625.

Figure 6F:
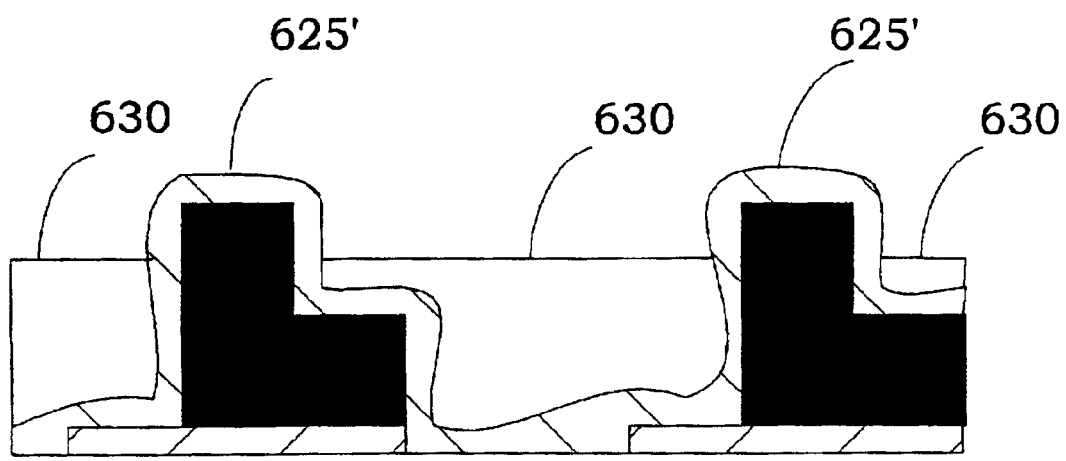

Next, the second polymer layer is etched back until all of the second thin film stack that was deposited on the horizontal surfaces of the initial resist has been revealed. FIG. 6(f) shows the exposed second thin film stack 625' after etching the second polymer layer 630. It should be noted that it is not necessary that the second thin film stack act as an etch stop for this process, since it will be removed.

Figure 6G:
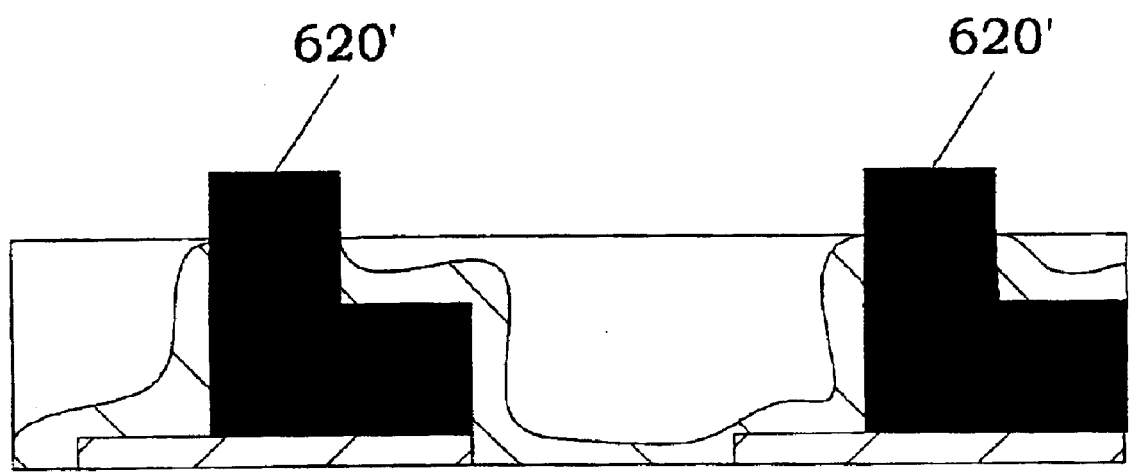
Figure 6H:
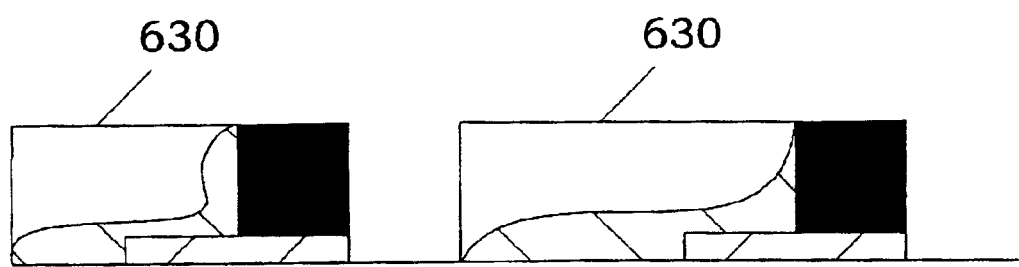

Next, the second thin film stack is etched from the top surface of the resist structure. It is important that the etch process used here does not erode the second polymer at a rate greater than the rate at which the second thin film stack is etched. FIG. 6(g) shows the exposed portions of the resist 620' after the second thin film stack has been etched. Next, the next thinnest section of the resist structure is etched away thereby exposing another portion of the first thin film stack. This portion of the first film stack is then removed by the same or different etch process. Preferably, the set of etch processes used to remove the resist and the first thin film stack do not remove the second thin film stack that covered by the second polymer. This may be achieved by having either the second polymer layer or the top layer of the second thin film stack resist the etch processes that remove the first thin film stack and the resist. FIG. 6(h) shows the remaining portion of the second polymer layer 630.

Figure 6I:
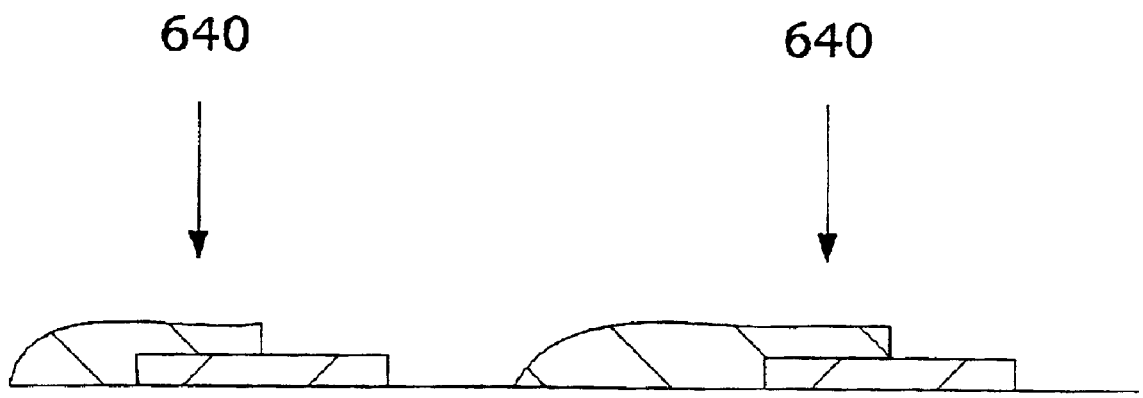

Finally, the remaining portion of the resist structure and the second polymer layer are removed thereby forming a cross-point array. Again, an additional step includes a light cleaning to remove any residual films on the sidewalls that could possibly produce shunts in the final device. FIG. 6(i) shows the structure comprising of the cross-point arrays 640.

Figure 7:
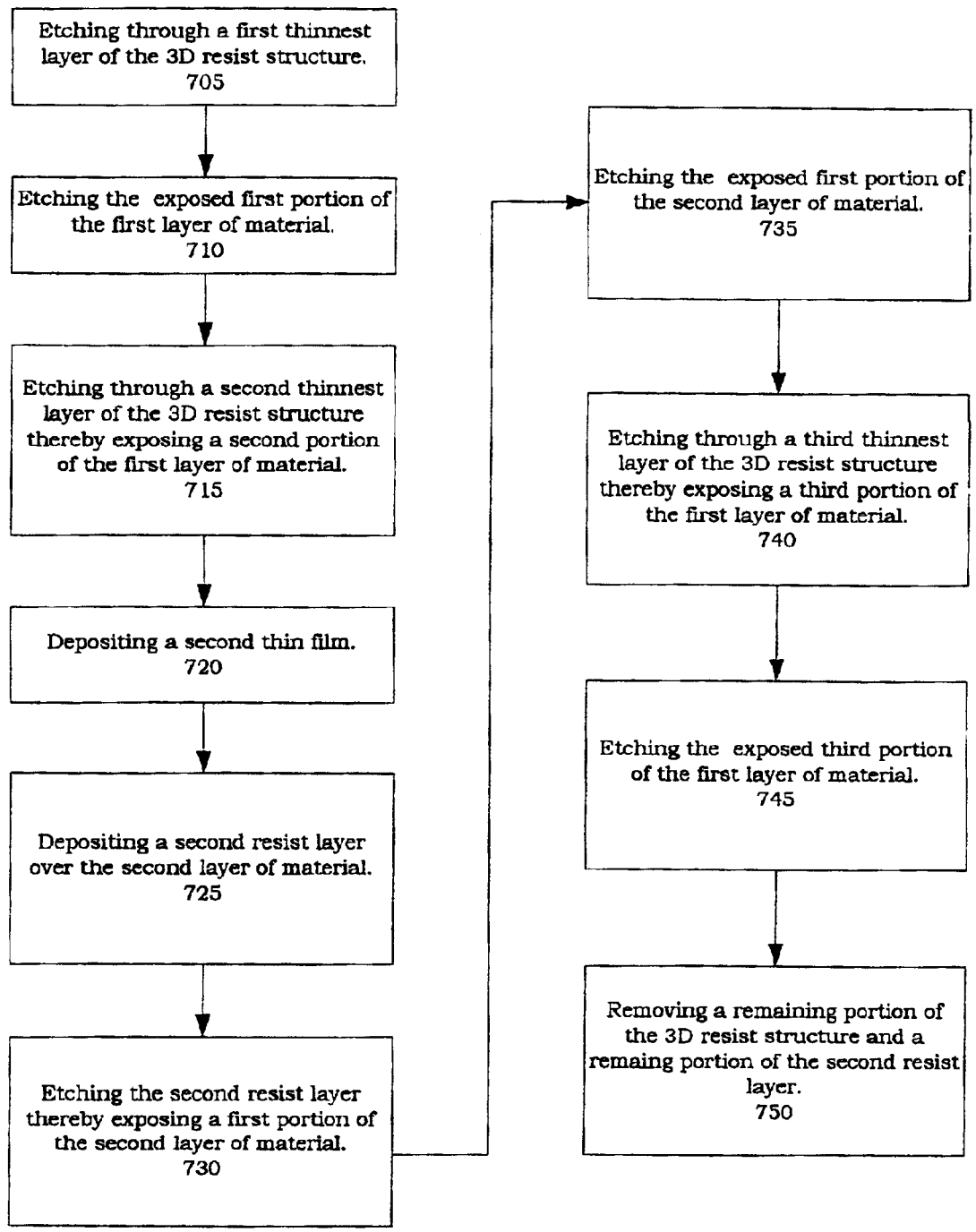
FIG. 7 is a flowchart of the second embodiment of the method in accordance with the present invention.

For a better understanding of the above-described approach, please refer now to FIG. 7. FIG. 7 is a flowchart of the above-described method in accordance with the present invention. First, once the resist structure is formed, a first thinnest layer of the resist structure is anisotropically etched, thereby exposing a first portion of the first thin film stack, via step 705. Next, the exposed first portion of the first thin film stack is etched thereby exposing a portion of the substrate, via step 710. A second thinnest layer of the resist structure is then etched thereby exposing a second portion of the first thin film stack, via step 715.

Next, second thin film stack is deposited, via step 720. Preferably, the second thin film stack preferably comprises a semiconductor material and a conductive material. A second resist layer is then applied over the second thin film stack, via step 725. Preferably, the second resist layer is capable of being applied via a roll coating process. Next, the second resist layer is etched thereby exposing a first portion of the second thin film stack, via step 730. This portion of the second film layer is then etched, step 735. Next a third thinnest layer of the resist is etched thereby exposing a third portion of the first thin film stack, via step 740. This exposed portion is then etched, via step 745. Finally, remaining portions of the resist and the second resist layer are removed, via step 750.

Capillary Forces

A third approach to utilizing the 3D resist structure to form a cross-point array takes into account the phenomenon of capillary forces. Capillary forces are what cause resist material to be more readily drawn into narrow channels as opposed to wider channels. For a better understanding of this concept, please refer now to FIG. 8.

Figure 8:
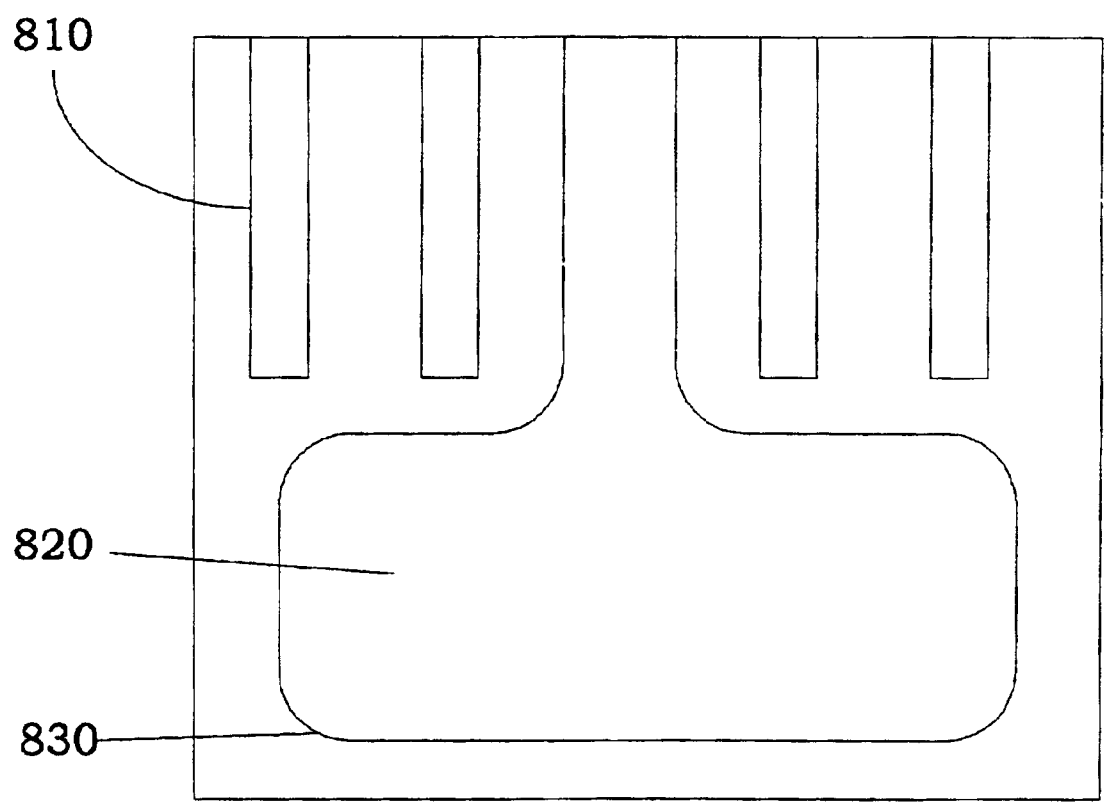
FIG. 8 shows the results of an experiment where a substrate was coated with a thin layer of photopolymer and subsequently molded by an ultraviolet transparent mold of PDMS.

FIG. 8 shows the results of an experiment where a substrate was coated with a thin layer of photopolymer and subsequently molded by an ultraviolet (UV) transparent mold of PDMS (polydimethylsiloxane). In this example, the stamp comprised narrow (10 um) and wider (100 um) features, with a depth of 5.6 um. A thin layer (0.9 um) of UV curable polymer was applied to a substrate. When the stamp was in contact with the liquid polymer, capillary forces drew most of the polymer into the narrow channels 810 and less polymer was drawn to the wider region 820. It was also observed, that more polymer was drawn to the corner area 830 of the wider region 820.

Figure 9:
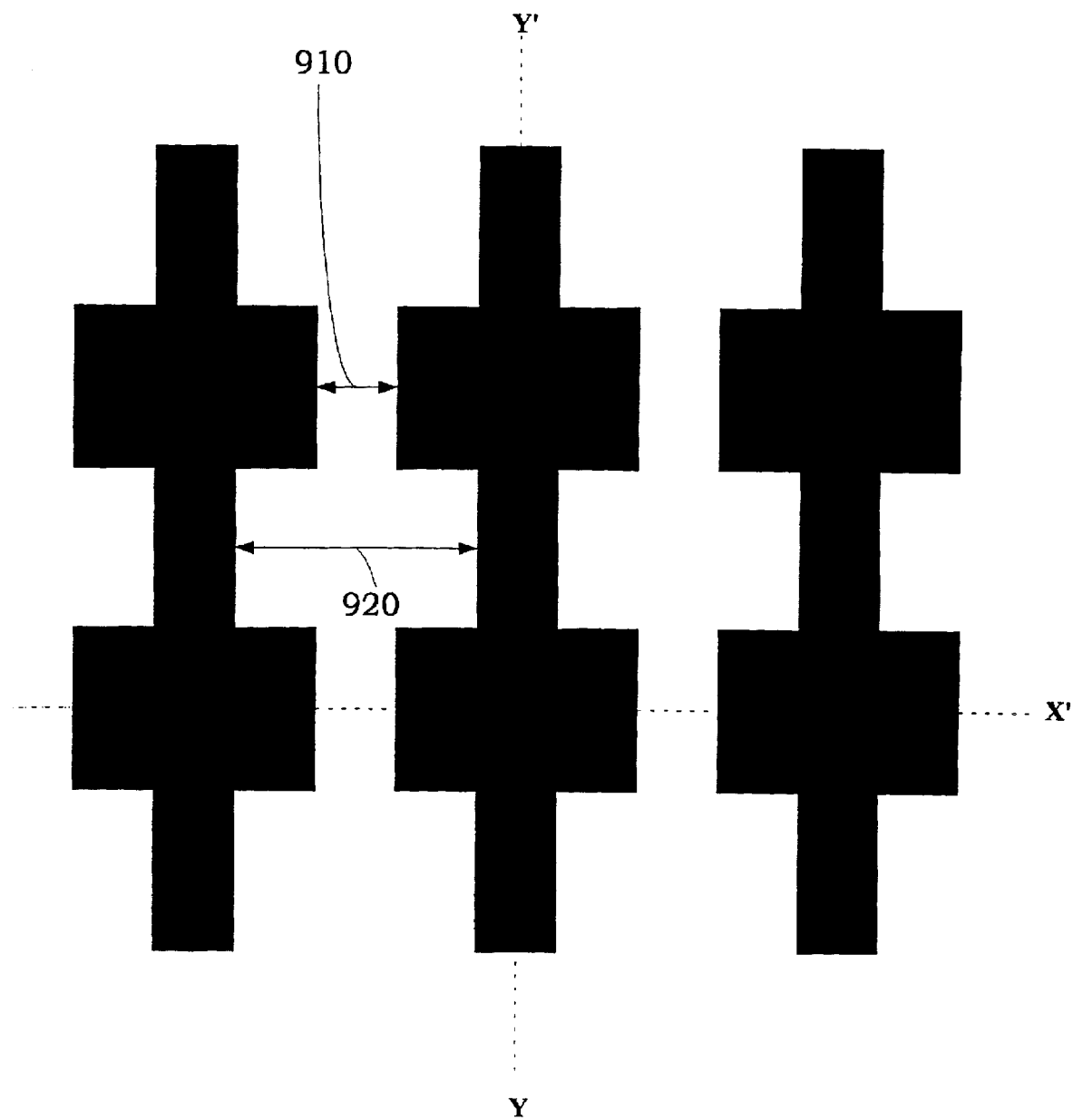
FIG. 9 is an illustration of a topology whereby a first feature is more narrow than a second feature.

For a clearer understanding, please refer to FIG. 9. FIG. 9 is an illustration of a topology whereby a first feature 910 is more narrow than a second feature 920. Because the first feature 910 is more narrow than the second feature 920, capillary forces cause a subsequently deposited polymer material to be more readily drawn to the first feature 910 than the second feature 920. Consequently, since the first feature 910 will comprise a layer of polymer material thicker than that of the second feature 920, the underlying material can be easily patterned based on subsequent processing steps.

For a better understanding of this approach, please refer now to FIGS. 10(a)–10(j) in conjunction with the following description. FIGS. 10(a)–10(l) illustrate a process of forming a cross-point array by utilizing capillary forces. FIG. 10(a) shows the X–X' cross-section (from FIG. 9) view a configuration comprising a flexible substrate 1010, a first layer of material ('first thin film stack') 1015, and a formed 3D resist structure 1020 wherein a plurality of different vertical heights are present throughout the structure 1020. FIG. 10(b) shows the Y–Y' cross-section view of the configuration. Also shown in both views is feature 910 which corresponds to feature 910 of the topology of FIG. 9.

Once, the resist structure is formed, the thinnest layer of the resist structure is removed via an anisotropic etch process thereby exposing a portion of the first thin film stack. FIG. 10(c) shows the X–X' cross-section view of the configuration whereby a portion of the first thin film stack 1015' has been exposed. FIG. 10(d) shows the Y–Y' cross-section view of the configuration after the above described etch processes.

Next, a second layer of material (second thin film stack) is deposited. The second thin film stack preferably comprises a semiconductor material and a conductive material. FIGS. 10(e) and 10(f) respectively show X–X' and Y–Y' cross-section views of the configuration after the deposition of the second film stack 1030.

A second polymer is then applied over the entire structure. Two techniques in applying the second polymer are contemplated. Utilizing a first technique, the second polymer has a relatively low viscosity and readily wets the resist. The amount of the second polymer applied is not sufficient to completely fill the voids that are present on the topology of the structure, but due to capillary forces, the second polymer will be more readily drawn into the narrow passages. Consequently, these regions will be filled to a greater depth than the regions where there is a larger space between the walls.

The second contemplated technique involves applying the second polymer uniformly over the structure using a vapor phase deposition or vacuum deposition process. Again, based on capillary forces, the narrow gaps would be obscured before the larger gaps. Also, the second polymer may have the same or different chemical composition as the resist structure since this process relies on geometrical effects and not etch selectivity. FIGS. 10(g) and 10(h) respectively show X–X' and Y–Y' cross-section views of the configuration after the deposition of the second polymer 1040.

Although the above-described approach is disclosed as being utilized in conjunction with polymer materials, one of ordinary skill in the art will readily recognize that any of a variety of resist compounds could be utilized while remaining within the spirit and scope of the present invention.

Once the second polymer is applied, an anisotropic etch is performed whereby the exposed second film stack is removed thereby exposing a portion of the first resist. FIGS. 10(i) and 10(j) respectively show X–X' and Y–Y' cross-section views of the configuration after the anisotropic etch is performed. FIG. 10(j) shows the exposed resist 1020'. Next, the resist and the second polymer are removed. The areas where the second film stack cover the first film stack are cross-point arrays. FIGS. 10(k) and 10(l) respectively show X–X' and Y–Y' cross-section views of the formed cross-point arrays 1050.

Figure 11:
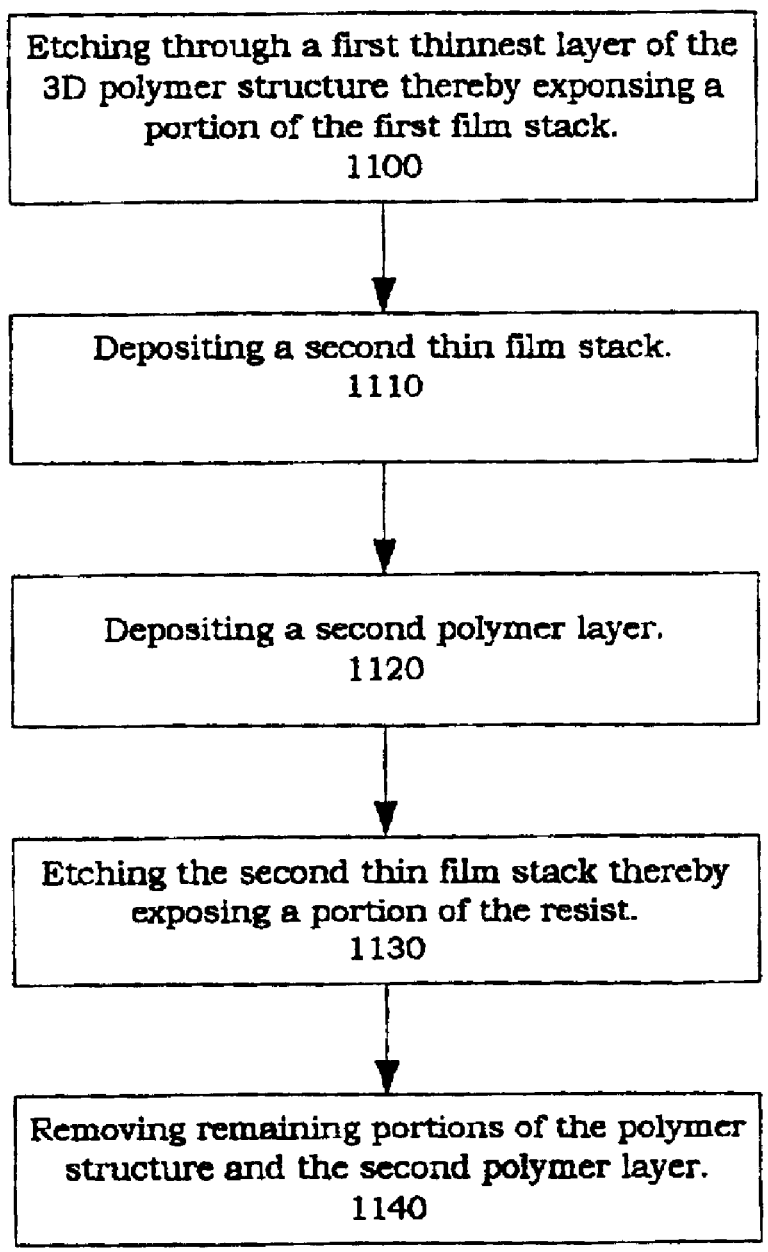
FIG. 11 is a flowchart of the third embodiment of the method in accordance with the present invention.

For a better understanding of the above-described approach, please refer now to FIG. 11. FIG. 11 is a flowchart of the above-described method in accordance with the present invention. First, once the resist structure is formed, a first thinnest layer of the resist structure is anisotropically etched, thereby exposing a first portion of the first thin film stack, via step 1100. Preferably, the formed resist structure comprises at least one feature that is wider than another feature. A second thin film stack is then deposited, via step 1110. Preferably, the second thin film stack comprises a semiconductor material and a conductive material.

Next, second polymer layer is deposited, via step 1120. An anisotropic etch is then performed whereby the second thin film stack is removed thereby exposing a portion of the resist, via step 1130. Finally, the remaining portions of the resist and the second polymer are removed, via step 1140.

A method and system for forming a semiconductor device has been disclosed. The method and system involve the utilization of a stamping tool to generate 3D resist structures whereby thin film patterns can be transferred to the resist in a single molding step and subsequently revealed in later processing steps.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method of forming a semiconductor device comprising:
   depositing a first layer of material over a substrate;
   depositing a layer of resist over the first layer of material; and
   utilizing a stamping tool to form a 3-dimensional (3D) pattern within the layer of resist forming a 3D resist structure over the substrate wherein the 3D resist structure comprises a plurality of different vertical heights throughout the structure.

2. The method of claim 1 wherein the plurality of different vertical heights comprises at least one height that is substantially different from another height.

3. The method of claim 2 wherein the substrate is a flexible substrate material.

4. The method of claim 1 wherein forming a 3D resist structure further comprises:
   curing the layer of resist thereby forming the 3D resist structure.

5. The method of claim 4 wherein the method further comprises:
   creating a cross-point array over the substrate.

6. The method of claim 5 wherein the act of creating a cross-point array further comprises:
   anisotropically etching through a first thinnest layer of the 3D resist structure thereby exposing a first portion of the first layer of material.

7. The method of claim 6 wherein the act of creating a cross-point array further comprises:
   etching the exposed first portion of the first layer of material whereby a plurality of pockets are formed in the substrate wherein each of the plurality of pockets comprise a depth greater than the thickness of the first layer of material;
   etching through a second thinnest layer of the 3D resist structure thereby exposing a second portion of the first layer of material;
   etching the exposed second portion of the first layer of material;
   etching through a third thinnest layer of the 3D resist structure thereby exposing a third portion of the first layer of material;
   depositing a second layer of material over the exposed portions of the first layer of material and a remaining portion of the 3D resist structure wherein the second layer of material comprises a semiconductor material and a conductive material; and
   removing the remaining portion of the 3D resist structure.

8. The method of claim 7 wherein the semiconductor device is at least one of a transistor, a resistor, a capacitor, a diode, a fuse and an anti-fuse.

9. The method of claim 6 wherein the act of creating a cross-point array further comprises:
   etching the exposed first portion of the first layer of material thereby exposing a portion of the substrate;
   etching through a second thinnest layer of the 3D resist structure thereby exposing a second portion of the first layer of material;
   depositing a second layer of material over the exposed portions of the first layer of material and a remaining portion of the 3D resist structure wherein the second layer of material comprises a semiconductor material and a conductive material;
   roll-coating a second resist layer over the second layer of material wherein the second resist layer has a different etch rate than the 3D resist structure;
   etching the second resist layer thereby exposing a first portion of the second layer of material;
   etching the first portion of the second layer of material;
   etching the third thinnest layer of the 3D resist structure thereby exposing a third portion of the first layer of material;
   etching the third portion of the first layer of material; and
   removing a remaining portion of the 3D resist structure and a remaining portion of the second resist layer.

10. The method of claim 9 wherein the semiconductor device is at least one of a transistor, a resistor, a capacitor, a diode, a fuse and an anti-fuse.

11. The method of claim 6 wherein the 3D resist pattern comprises at least one feature that is wider than another feature.

12. The method of claim 11 wherein the 3D resist structure comprises at least one channel that is narrower than another channel and the act of creating a cross-point array further comprises:
   depositing a second layer of material over the exposed portion of the first layer of material and a remaining portion of the 3D resist structure wherein the second layer of material comprises a semiconductor material and a conductive material;
   depositing a second resist layer over the second layer of material wherein the second resist layer is more readily drawn to the at least one channel;
   anisotropically etching the second layer of material thereby exposing a portion of the 3D resist structure; and
   removing the remaining portion of the 3D resist structure and the remaining portion of the second resist layer.

13. The method of claim 12 wherein the semiconductor device is at least one of a transistor, a resistor, a capacitor, a diode, a fuse and an anti-fuse.

14. A method of forming a semiconductor device comprising:
   providing a flexible substrate material;
   depositing a first layer of material over the flexible substrate; and depositing a layer of resist over the first layer of material;

utilizing a stamping tool to form a 3D pattern in the layer of resist;

curing the layer of resist thereby forming a 3D resist structure over the first layer of material wherein the 3D resist structure comprises a plurality of different vertical height wherein at least one height is substantially different from another height; and utilizing the 3D resist structure to create a cross-point array on the flexible substrate.

15. The method of claim 14 wherein the act of utilizing the 3D resist structure to create a cross-point array further comprises:

anisotropically etching through a first thinnest layer of the 3D structure thereby exposing a first portion of the first layer of material.

16. The method of claim 15 wherein the act of utilizing the 3D resist structure to create a cross-point array further comprises:

etching the exposed first portion of the first layer of material whereby a plurality of pockets are formed in the substrate wherein each of the plurality of pockets comprise a depth greater than the thickness of the first layer of material;

etching through a second thinnest layer of the 3D resist structure thereby exposing a second portion of the first layer of material;

etching the exposed second portion of the first layer of material;

etching through a third thinnest layer of the 3D resist structure thereby exposing a third portion of the first layer of material;

depositing a second layer of material over the exposed portions of the first layer of material and a remaining portion of the 3D resist structure wherein the second layer of material comprises a semiconductor material and a conductive material; and removing the remaining portion of the 3D resist structure.

17. The method of claim 15 wherein the act of utilizing the 3D resist structure to create a cross-point array further comprises:

etching the exposed first portion of the first layer of material thereby exposing a portion of the substrate;

etching through a second thinnest layer of the 3D resist structure thereby exposing a second portion of the first layer of material;

depositing a second layer of material over the exposed portions of the first layer of material and a remaining portion of the 3D resist structure wherein the second layer of material comprises a semiconductor material and a conductive material;

roll-coating a second resist layer over the second layer of material wherein the second resist layer has a different etch rate than the 3D resist structure;

etching the second resist layer thereby exposing a first portion of the second layer of material;

etching the first portion of the second layer of material;

etching the third thinnest layer of the 3D resist structure thereby exposing a third portion of the first layer of material;

etching the third portion of the first layer of material; and removing a remaining portion of the 3D resist structure and a remaining portion of the second resist layer.

18. The method of claim 15 wherein the 3D pattern comprises at least one feature that is wider than another feature.

19. The method of claim 18 wherein the 3D resist structure comprises at least one channel that is narrower than another channel and the act of utilizing the 3D resist structure to create a cross-point array further comprises:

depositing a second layer of material over the exposed portion of the first layer of material and a remaining portion of the 3D resist structure wherein the second layer of material comprises a semiconductor material and a conductive material;

depositing a second resist layer over the second layer of material wherein the second resist layer is more readily drawn to the at least one channel;

anisotropically etching the second layer of material thereby exposing a portion of the 3D resist structure; and removing the remaining portion of the 3D resist structure and the remaining portion of the second resist layer.

20. A method of forming a device comprising:

providing a flexible substrate material;

depositing a first layer of material over the flexible substrate; and depositing a layer of resist over the first layer of material;

utilizing a stamping tool to form a 3D pattern in the layer of resist;

curing the layer of resist thereby forming a 3D resist structure over the first layer of material wherein the 3D resist structure comprises a plurality of different vertical height wherein at least one height is substantially different from another height; and utilizing the 3D resist structure to create a cross-point array on the flexible substrate.

* * * * *